United States Patent [19]

Flaherty

[11] Patent Number: 4,855,623
[45] Date of Patent: Aug. 8, 1989

[54] OUTPUT BUFFER HAVING PROGRAMMABLE DRIVE CURRENT

[75] Inventor: Edward H. Flaherty, Houston, Tex.

[73] Assignee: Texas Instruments Incorporated, Dallas, Tex.

[21] Appl. No.: 117,709

[22] Filed: Nov. 5, 1987

[51] Int. Cl.⁴ .................. H03K 19/092; H03K 19/094
[52] U.S. Cl. ..................................... 307/475; 307/473; 307/270; 307/491; 307/451
[58] Field of Search ............... 307/465, 469, 270, 475, 307/451, 491, 473

[56] References Cited

U.S. PATENT DOCUMENTS

| | | | |
|---|---|---|---|
| 4,533,841 | 8/1985 | Konishi | 307/469 |
| 4,634,893 | 1/1987 | Craycraft et al. | 307/475 |
| 4,691,124 | 9/1987 | Ledzius et al. | 307/491 |
| 4,691,127 | 9/1987 | Huizer | 307/475 |
| 4,719,369 | 1/1988 | Asano et al. | 307/469 |

Primary Examiner—Stanley D. Miller
Assistant Examiner—Richard Roseen
Attorney, Agent, or Firm—Theodore D. Lindgren; Thomas W. DeMond; Melvin Sharp

[57] ABSTRACT

The specification discloses output buffer circuitry (10) for providing selected output driving characteristics. A plurality of input terminals (13, 24 and 30) receive control and data signals. A plurality of interconnected driver transistors (20, 28, 36 and 42) are connected to an output terminal (22). Drive selector circuitry (16, 18, 38 and 40) is connected between the input terminals (13, 24, and 30) and is responsive to the control signals to vary the electrical interconnection of the driver transistors (20, 28, 36 and 42). The output driving characteristics presented to the output terminal (22) are variable in response to the control signals.

11 Claims, 1 Drawing Sheet

OUTPUT BUFFER HAVING PROGRAMMABLE DRIVE CURRENT

TECHNICAL FIELD OF THE INVENTION

This invention relates to output buffers, and more particularly relates to CMOS output buffers having programmable speed, voltage and current driving characteristics.

BACKGROUND OF THE INVENTION

Output buffers are commonly used with a variety of electrical circuits. For example, CMOS output buffers are used to provide desired drive characteristics for logical functions on semiconductor chips. Traditionally, such output buffers have been designed for specific circuits to provide specified speed, voltage and current driving characteristics under worst case environmental and loading conditions. These conditions are typically high temperature, low voltage supply, and a heavy load. Under conditions of low temperature, high voltage or a light load, the designed drive characteristics of the buffer may become grossly inappropriate, or may induce electrical interference into the surrounding semiconductor circuitry.

As semiconductor circuits become increasingly complex, more and more logical functions are being integrated into single chips. Typically, several logical functions may share a single output buffer in such circuits. However, the required drive characteristics for one of the functions may not be compatible with those of another function sharing the same output pin.

A need has thus arisen for a technique for selectively changing the output drive characteristics of an output buffer while operating, in order to compensate for changes in environment or function.

SUMMARY OF THE INVENTION

In accordance with the present invention, an output buffer method and apparatus is provided which substantially eliminates or prevents the disadvantages and problems associated with prior output devices.

In accordance with one aspect of the present invention, circuitry is provided to vary output driving characteristics of an output buffer which includes a plurality of driver elements, each connected to an output terminal. A driver selector is connected to the driver elements, and a plurality of inputs are connected to the driver selector to receive control and enabling signals. The driver selector is responsive to the control and enabling signals in order to vary the electrical interconnection of the driver elements to vary the output driving characteristics of the circuitry.

In accordance with yet another aspect of the invention, an input buffer provides selected output driving characteristics by including a plurality of input terminals for receiving control and data signals. A drive selector is connected between the input terminals and is connected at its output to a plurality of interconnected driver transistors. The drive selector is responsive to the control signals to vary the electrical interconnection of the driver transistors. An output terminal is connected to the driver transistors for outputting the data signals. The output driving characteristics being presented to the output terminal are variable in response to the control signals.

In accordance with yet another aspect of the invention, a method of varying the output drive characteristics of an output buffer includes applying control signals to the output buffer. Data signals are also applied to the output buffer. The speed and impedance driving characteristics of the output buffer are varied in response to the control signals. Output signals are generated in response to the data signals, the output signals having the driving characteristics specified by the control signals.

The present invention provides the technical advantage that a single output buffer may be used to serve different functions requiring diverse output characteristics. Further, the present invention may be used to adjust its characteristics in response to real-time environmental changes.

BRIEF DESCRIPTION OF THE DRAWINGS

For a more complete understanding of the present invention and the advantages thereof, reference is now made to the following description taken in conjunction with the accompanying drawing, in which.

DETAILED DESCRIPTION OF THE INVENTION

Figure 1:
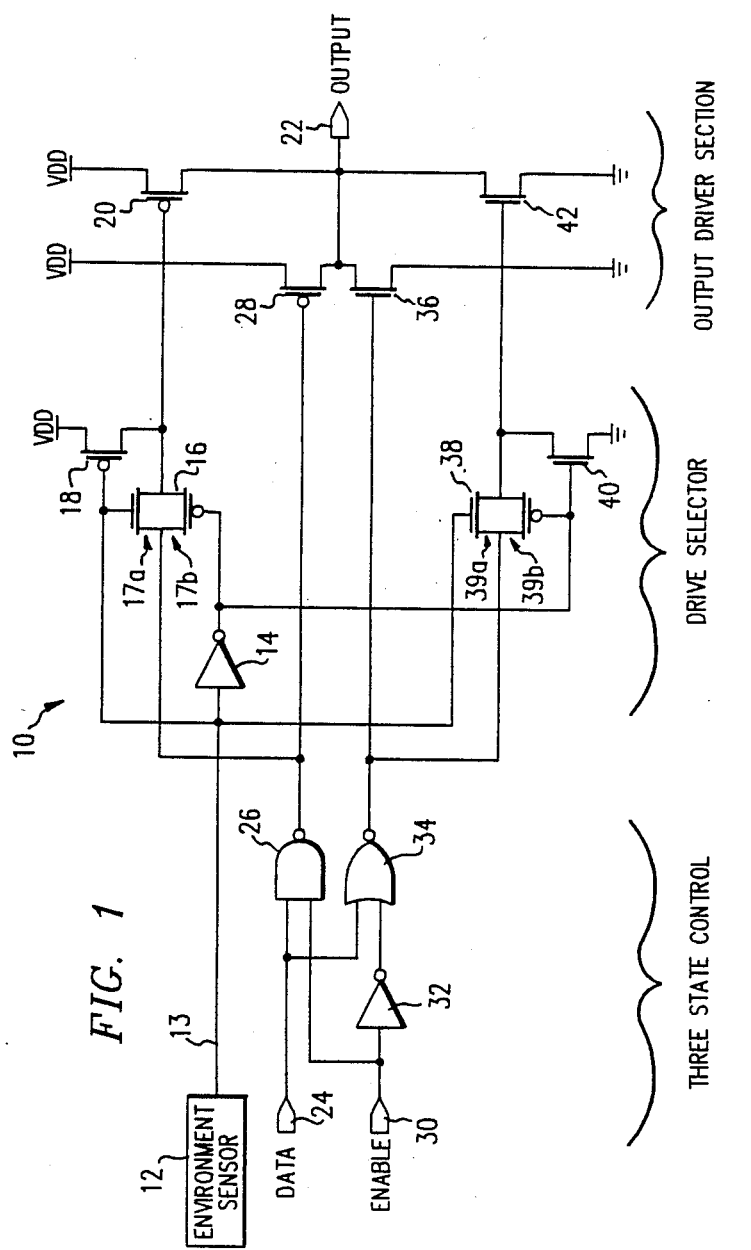
FIG. 1 illustrates a schematic diagram of the preferred embodiment of the invention.

FIG. 1 illustrates the preferred embodiment of the present invention. The output device 10 includes an environment sensor 12 which senses selected environmental characteristics and generates a logic function control signal to control signal terminal 13. The control functions or control signals to terminal 13 are applied to the input of an inverter 14, the output of which is connected to a CMOS transfer gate (CTR) 16. As is known, the CTR 16 comprises interconnected N channel 17a and P channel 17b transistors. The gate of the N channel transistor 17a is connected to terminal 13, while the gate of the P channel transistor 17b is connected to the output of the inverter 14. A PMOS transistor 18 is connected at its source to the source of voltage supply $V_{dd}$. The drain of transistor 18 is connected to the output of the CRT 16. The output or output of CRT 16 is also connected to the input or gate of a PMOS driver transistor 20. The drain of transistor 20 is connected to a buffer output terminal 22 and the source of transistor 20 is connected to $V_{dd}$.

Logical data from the associated circuitry on the chip is applied to data input terminal 24. The output of terminal 24 is applied to an input of an NAND gate 26, the output of which is applied to the input or gate of a PMOS driver transistor 28 and to the input of CTR 16. The output or drain of transistor 28 is also connected to output terminal 22 and the source of the transistor 28 is connected to $V_{dd}$.

An enable terminal 30 receives logical enable signals from the associated circuitry and applies the signals through an inverter 32 to an input of a NOR gate 34. The data signals are also applied from terminal 24 to an input of NOR gate 34, and the enable signals are applied from terminal 30 to an input of NAND gate 26. The output of NOR gate 34 is applied to the input or gate of an NMOS driver transistor 36, the output or drain of which is connected to the buffer output terminal 22. The source of the transistor 36 is connected to ground.

The output of gate 34 is also connected to the input of CTR 38. The gate of the N channel transistor 39a associated with the CTR 38 is connected to the terminal 13 and the gate of the P channel transistor associated with the CTR 38 is connected to the output of the inverter 14. An NMOS transistor 40, having its gate connected to the output of inverter 14, is connected between circuit ground and the output of CRT 38. The output of CTR 38 is applied to the input or gate of an NMOS transistor 42, the output or drain of, which is connected to the buffer output terminal 22 and the source of which is connected to ground.

As may be seen, the circuitry of the invention comprises three primary portions, the three state control comprising the terminals 13, 24 and 30 and their associated gates 26 and 34. The second aspect of the circuitry comprises a drive selector section comprising the CTRs 16 and 38 and transistors 18 and 40. The third portion of the circuitry comprises an output driver section comprising the series-parallel interconnection of four driver transistors 20, 28, 36 and 42 with outputs connected to output terminal 22 and with gate inputs connected to the outputs of the drive selector section.

The environment sensor 12 may comprise any of a plurality of sensors for sensing such things as the environmental temperature or the supply voltage. Alternatively, the control signals applied to terminal 13 may be generated by software programmable control.

In an embodiment where the environment sensor 12 comprises an environmental temperature sensor, the circuit operates to provide a low output current capacity output buffer in the presence of a low environmental temperature. In the presence of a high environmental temperature, the circuit is reconfigured to provide a high output current capacity mode. In an embodiment where the environment sensor 12 senses the supply voltage, the circuit is connected in a low output current capacity mode in the presence of a high supply voltage. In the presence of a lower supply voltage, the circuit is reconfigured to provide a high output current capacity mode.

In this way, the output buffer of the invention can be continually reconfigured into an optimal output characteristic mode dependent upon the sensed environmental conditions and in accordance with software programmable instructions. It will be understood that although the present circuitry is disclosed as being switchable between two output characteristic modes, that the invention may comprise more complex circuitries with three or more possible output characteristics.

In operation of the present invention, the output buffer is interconnected into the fast response speed capacity, high output current capacity mode, when the output of the environment sensor 12 is placed at a logical "1". When the logic level applied to terminal 13 is placed at a logic "0," the output buffer is configured in the slow response, low speed current capacity mode. When the enable terminal 30 is placed at a logical "0," the output terminal 22 is placed in a high output impedance or "floating" state. When the enable 30 terminal is placed at a logical "1," the output terminal 22 assumes the same logical value as applied to the data terminal 24, with the drive characteristics currently being specified by the logical signal appearing at terminal 13.

Specifically, it will be seen that the output driver section comprises two banks of driver transistors: a first bank of driver transistors comprising transistors 28 and 36 and a second bank of driver transistors comprising transistors 20 and 42. The drive selector elements operate to determine which of the two banks will be active. If the logical level applied to terminal 13 is a logical "0," the STRs 16 and 38 will be turned off, and transistors 18 and 40 will be turned on. Since the gates of transistor 20 and 42 will be pulled high and low, respectively, the bank comprising transistors 20 and 42 will be disabled. Thus, the output buffer will have electrically connected only transistors 28 and 36 to provide a slow, low current mode of operation. If the logic level applied to terminal 13 is a logical "1," the STRs 16 and 38 will be turned on, connecting the outputs of the NAND gate 26 and the NOR gate 34 to the gates of the transistors 20 and 42, respectively. Thus, transistors 28 and 20 are logically wired in parallel, as are transistors 36 and 42. This effectively creates a single, very large output driver circuit providing the buffer with a fast, high current characteristic.

The three state control is utilized to enable or disable the output, as previously described. If the enable input applied to terminal 30 is a logic "0," then the output of the NAND gate 26 must be a logical "1" and the output of the NOR gate 34 must be a logical "0". Thus, the output driver transistors are all unconditionally turned off to provide a high impedance output. If the enable signal applied to terminal 30 is a logic "1," the appropriate output driver transistors will be turned on according to the levels applied to the data signals applied to terminal 24 and in accordance with the control signals applied to terminal 13.

It will be understood that if it is desired that the fast, high current mode has half of the output impedance of the slow, low current mode that the sizes of the driver transistors 20, 28, 36 and 42 will all be equal. If other ratios between the two modes are desired, then the sizes of the driver transistors can be tailored to provide the desired ratio.

The present invention is useful in any device wherein it is desirable to change the output drive characteristics of the pins. An example of the present invention is a single chip microcomputer wherein a pin may be used as a simple digital I/O port, or may be reconfigured by the present invention to be part of a high speed communications port. Another example of the use of the invention is a device which is able to sense its environmental conditions as previously disclosed. When harsh conditions are sensed, the device can dynamically change the pin drive characteristics to compensate.

Although the present invention has been described in detail, it should be understood that various changes, substitutions and alterations can be made herein without departing from the spirit and scope of the invention as defined by the pending claims.

What is claimed is:

1. Circuitry for varying the output driving characteristics of a logical data signal received at a data input terminal, the variation in response to control signals received at a control signal terminal, and for providing a high impedance output driving characteristic in response to logical enable signals at an enable terminal, comprising:
   a series-parallel interconnection of driver elements, each driver element with output connected to an output terminal
   and responsive to said logical data signal and an inversion of said logical data signal;
   driver selector means with outputs connected to gate inputs of said driver elements;
   a control circuit with outputs for providing said control signals, said enable signals, inversions of said enable signals, said data signal, and an inversion of said data signal to the input of said driver selector means;

said control circuit including said control signal terminal, said data input terminal and said enable terminal;

said driver selector means repsonsive to said control signals for enabling and disenabling a second bank of said series-parallel electrical interconnection of driver elements to vary the output driving characteristics of said circuitry; and said driver selector means responsive to said enable signals and said inversions of said enable signals for enabling and disenabling said second bank and a first bank of said series-parallel interconnection of driver elements.

2. The circuitry of claim 1, wherein said output driving characteristics include an output impedance of said circuitry.

3. The circuitry of claim 1, wherein said output driving characteristics include an output current capacity of said circuitry.

4. The circuitry of claim 1, wherein said output driving characteristics include the response speed capacity of said circuitry.

5. The circuitry of claim 1
wherein said driver selector means includes CMOS transfer gates connected between said outputs of said control circuit and said gate inputs of said driver selector means.

6. An output buffer providing selected output driving characteristics for a logical data signal in response to control signals and enable signals comprising:

a plurality of input terminals for receiving said control, enable and data signals;

a control circuit including said plurality of input terminals and including an output providing said control signals, said enable signals, inversion of said enable signals, said data signal and an inversion of said data signal;

drive selector circuitry connected to receive said control signal, said enable signals and inversions thereof, and said data signal and inversion thereof from outputs of said control circuit and responsive to said control and enabling signals for providing multiple gate-driving signal outputs;

a plurality of series-parallel interconnected driver transistors with gates connected to receive said gate-driving signal outputs from said drive select circuitry; and an output terminal connected to the outputs of said series-parallel interconnected driver transistors for outputting said data signal, the output driving characteristics presented to said output terminal being variable in response to said control signal and to said enable signal.

7. The output buffer of claim 6, wherein said series-parallel connection of driver transistors comprise
two banks having a total of four fieldeffect transistors.

8. The output buffer of claim 7, wherein said gate-driving signals cause said driver transistors to provide a fast response speed capacity, high output current capacity mode buffer circuit.

9. The output buffer of claim 8, wherein said gate-driving signals cause said pair of driver transistors to provide a slower response speed capacity, lower output current capacity mode buffer circuit.

10. The output bufer of claim 9, wherein said gate-driving signals cause said driver transistors to provide a high output impedance mode buffer circuit.

11. The output buffer of claim 6 wherein said driver selector circuitry includes CMOS transfer gates connected between said outputs of said control circuit and said gates of said driver transistors.

* * * * *